United States Patent
Lin et al.

(10) Patent No.: US 10,365,695 B2
(45) Date of Patent: Jul. 30, 2019

(54) ELECTRONIC DEVICE AND HINGE ASSEMBLY THEREOF

(71) Applicants: Chia-Chi Lin, Taipei (TW); Wei-Hao Lan, Taipei (TW); Che-Hsien Lin, Taipei (TW); Po-Jui Chen, Taipei (TW); Han-Sheng Siao, Taipei (TW); Chun-Chieh Chen, Taipei (TW); Cheng-Shiue Jan, Taipei (TW); Chen-Cheng Wang, Taipei (TW)

(72) Inventors: Chia-Chi Lin, Taipei (TW); Wei-Hao Lan, Taipei (TW); Che-Hsien Lin, Taipei (TW); Po-Jui Chen, Taipei (TW); Han-Sheng Siao, Taipei (TW); Chun-Chieh Chen, Taipei (TW); Cheng-Shiue Jan, Taipei (TW); Chen-Cheng Wang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/112,806

(22) Filed: Aug. 27, 2018

(65) Prior Publication Data
US 2018/0364768 A1   Dec. 20, 2018

Related U.S. Application Data

(62) Division of application No. 15/891,302, filed on Feb. 7, 2017, now Pat. No. 10,152,095.

(60) Provisional application No. 62/456,629, filed on Feb. 8, 2017, provisional application No. 62/484,886, filed
(Continued)

(51) Int. Cl.
*H05K 5/00* (2006.01)
*H05K 7/00* (2006.01)
*G06F 1/16* (2006.01)
*E05D 11/06* (2006.01)
*H05K 5/02* (2006.01)
*E05D 3/18* (2006.01)
*E05D 3/16* (2006.01)

(52) U.S. Cl.
CPC .......... *G06F 1/1681* (2013.01); *E05D 3/186* (2013.01); *E05D 11/06* (2013.01); *G06F 1/1616* (2013.01); *H05K 5/0226* (2013.01); *E05D 2003/163* (2013.01); *E05Y 2900/606* (2013.01)

(58) Field of Classification Search
CPC ....................................... H05K 5/00
See application file for complete search history.

(56) References Cited

U.S. PATENT DOCUMENTS

2013/0250492 A1* 9/2013 Wong .................... G06F 1/1641
361/679.01
2016/0205792 A1* 7/2016 Ahn ...................... H05K 5/0017
40/779

* cited by examiner

*Primary Examiner* — Jerry Wu
(74) *Attorney, Agent, or Firm* — JCIPRNET (57) ABSTRACT

An electronic device and a hinge assembly thereof are provided. The hinge assembly includes a first and a second fixed block, a first and a second polyline rod, a damper rod and a fastener. The first fixed block has a first and a second end, the second fixed block has a third and a fourth end, and the first polyline rod has a fifth and a sixth end, wherein the fifth end is connected to the second end, and the sixth end is connected to the fourth end. The second polyline rod has a seventh connected to the fourth end, and an eighth end, connected to the second end and the sixth end. The damper rod is slidably disposed on the first fixed block, the fastener is fixed to the first fixed block, and a distal end of the damper rod is fastened into the fastener.

21 Claims, 10 Drawing Sheets

Related U.S. Application Data on Apr. 13, 2017, provisional application No. 62/510,738, filed on May 24, 2017.

ELECTRONIC DEVICE AND HINGE ASSEMBLY THEREOF

CROSS-REFERENCE TO RELATED APPLICATION

This application is a divisional application of U.S. application Ser. No. 15/891,302, filed on Feb. 7, 2018, now pending, which claims the priority benefits of U.S. provisional application Ser. No. 62/456,629, filed on Feb. 8, 2017, U.S. provisional application Ser. No. 62/484,886, filed on Apr. 13, 2017, and U.S. provisional application Ser. No. 62/510,738, filed on May 24, 2017. The entirety of each of the above-mentioned patent applications is hereby incorporated by reference herein and made a part of this specification.

FIELD OF THE INVENTION

The invention relates to an electronic device and a hinge assembly, particularly to an electronic device and a hinge assembly thereof.

DESCRIPTION OF RELATED ART

In a general clamshell electronic device such as a notebook computer or a mobile phone, a hinge assembly is usually used to pivotally connect a display and a main body of the electronic device. Also, a user may cause the two housings of the electronic device to open or close relative to each other through the hinge assembly, thereby making the electronic device ready for use or for storage.

In detail, a general hinge assembly provides the clamshell electronic device with a fixed output of torsional force, so that during opening or closing, the display and the main body are prevented from generating different torsional forces when in different opening or closing positions. However, there is a possibility that that the display cannot be stably fixed in a predetermined position due to insufficient torsional force from the hinge assembly, or that a force from the user to rotate the display to the opening position cannot be buffered. In addition, during the process of rotating the display from the closing position to the opening position, the user may also experience difficulty smoothly opening the display due to excessive torsional force.

SUMMARY OF THE INVENTION

The invention provides a hinge assembly in which torsional force can be adaptively adjusted.

The invention provides an electronic device convenient for use by users.

A hinge assembly according to the invention includes a first fixed block, a second fixed block, a first connecting rod, a second connecting rod, at least one damper rod and at least one fastener. The first fixed block has a first end and a second end, the second fixed block has a third end and a fourth end, and the first connecting rod has a fifth end and a sixth end, wherein the fifth end is slidably and rotatably connected to the second end, and the sixth end is rotatably connected to the fourth end. The second connecting rod has a seventh end and an eighth end, wherein the seventh end is slidably and rotatably connected to the fourth end, and the eighth end is rotatably connected to the second end and the sixth end. The damper rod is slidably disposed on the first fixed block, the fastener is fixed to the first fixed block, and a distal end of the damper rod is fastened into the fastener.

An electronic device according to the invention includes a first housing, a second housing and a hinge assembly. The hinge assembly includes a first fixed block, a second fixed block, a first connecting rod, a second connecting rod, at least one damper rod and at least one fastener. The first fixed block has a first end and a second end, and the first end is attached to the first housing. The second fixed block has a third end and a fourth end, and the third end is attached to the second housing. The first connecting rod has a fifth end and a sixth end, wherein the fifth end is slidably and rotatably connected to the second end, and the sixth end is rotatably connected to the fourth end. The second connecting rod has a seventh end and an eighth end, wherein the seventh end is slidably and rotatably connected to the fourth end, and the eighth end is rotatably connected to the second end and the sixth end. The damper rod is slidably disposed on the second fixed block, the fastener is fixed to the second fixed block, and a distal end of the damper rod is fastened into the fastener.

A hinge assembly according to the invention includes a first fixed block, a second fixed block, a first polyline rod, a second polyline rod, at least one damper rod and at least one fastener. The first polyline rod is slidably and rotatably connected to the first fixed block and swingably connected to the second fixed block. The second polyline rod is slidably and rotatably connected to the second fixed block, swingably connected to the first fixed block and swingably connected to the first polyline rod. The damper rod is slidably disposed on the second fixed block, the fastener is fixed to the second fixed block, and a distal end of the damper rod is fastened into the fastener.

A hinge assembly according to the invention includes a first fixed block, a second fixed block, a polyline rod module, a first damper rod, a first fastener, a second damper rod and a second fastener. The polyline rod module is movably connected to the first fixed block and the second fixed block. The first damper rod is slidably disposed on the first fixed block, the first fastener is fixed to the first fixed block, and a distal end of the first damper rod is fastened into the first fastener. The second damper rod is slidably disposed on the second fixed block, the second fastener is fixed to the second fixed block, and a distal end of the second damper rod is fastened into the second fastener.

An electronic device according to the invention includes a first housing, a second housing, a first fixed block, a second fixed block, a polyline rod module, a damper rod and a fastener. The first fixed block is attached to the first housing. The second fixed block is attached to the second housing. The polyline rod module is movably connected to the first fixed block and the second fixed block. The damper rod is slidably disposed on the first fixed block, the fastener is fixed to the first fixed block, and a distal end of the damper rod is fastened into the fastener.

Based on the above, in the hinge assembly, torsional force is provided by matching the damper rod and the fastener with each other, wherein the torsional force can be adaptively adjusted by a structural arrangement of the fastener and the damper rod, so that the first housing and the second housing of the electronic device which employs the hinge assembly can be fixed at predetermined angles.

To make the above features and advantages of the invention more comprehensible, embodiments accompanied with drawings are described in detail as follows.

DETAILED DESCRIPTION OF DISCLOSED EMBODIMENTS

[First Embodiment]

Figure 1:
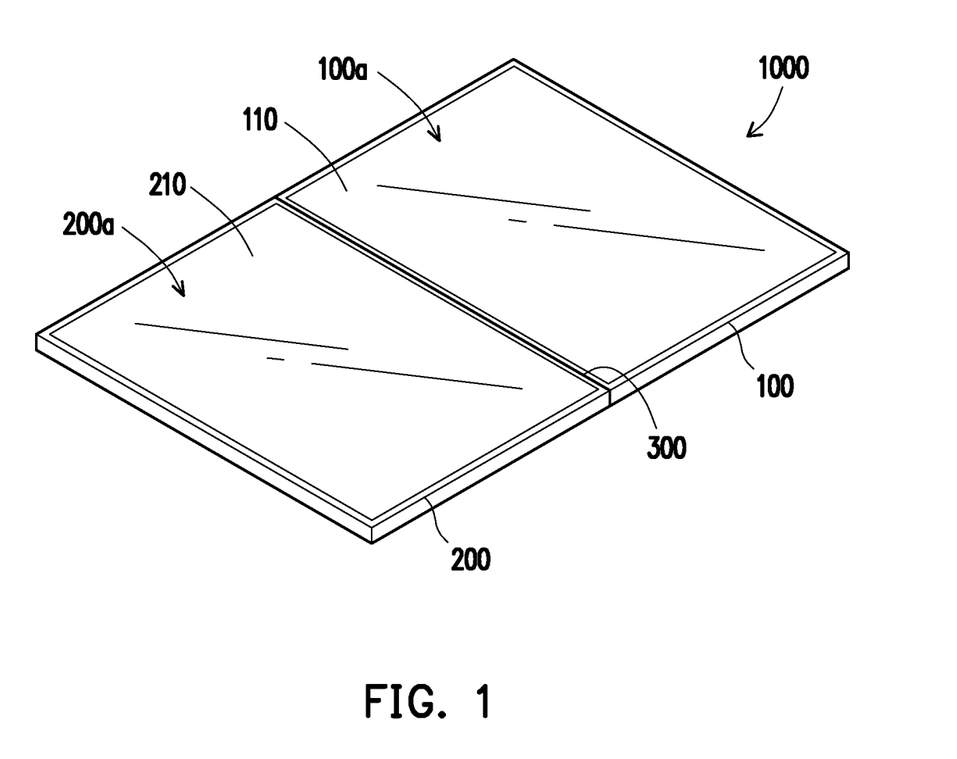
FIG. 1 is a schematic view of an electronic device according to an embodiment of the invention.
Figure 2:
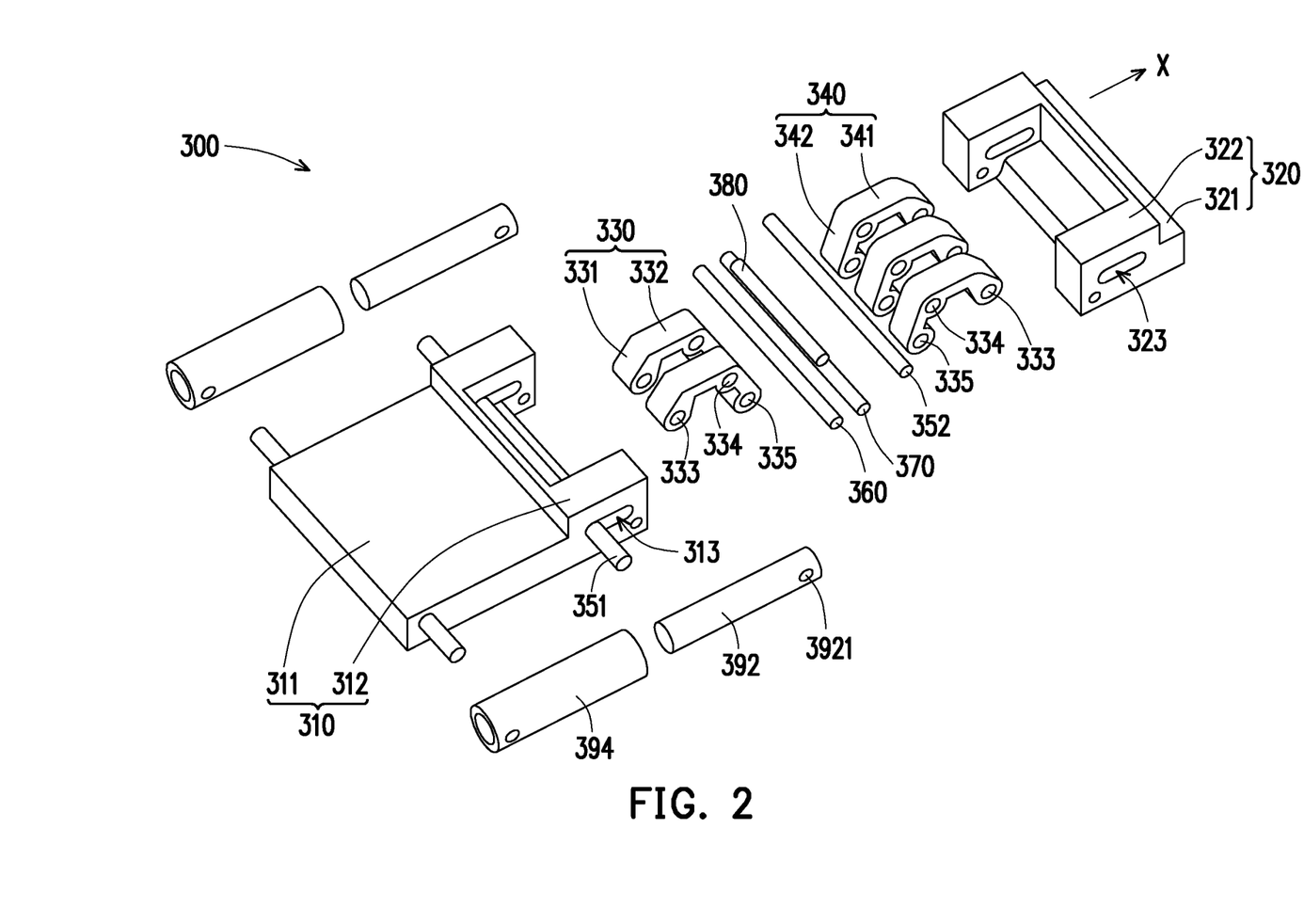
FIG. 2 is a schematic exploded view of a hinge assembly of a first embodiment of the electronic device in FIG. 1.
Figure 3:
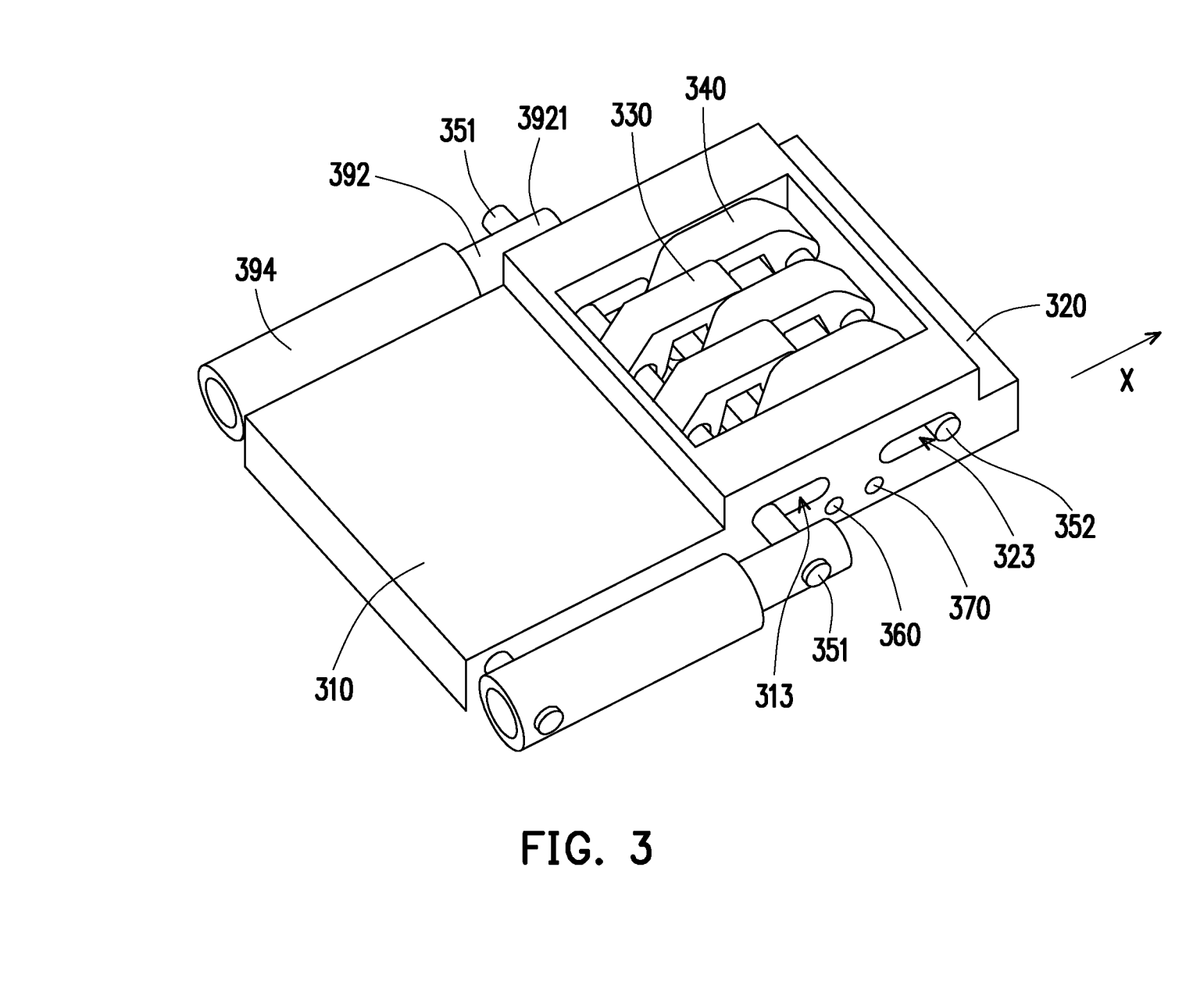
FIG. 3 is a schematic view illustrating assembly of the hinge assembly in FIG. 2.

FIG. 1 is a schematic view of an electronic device according to the invention, FIG. 2 is a schematic exploded view of a hinge assembly of a first embodiment of the electronic device in FIG. 1, and FIG. 3 is a schematic view illustrating assembly of the hinge assembly in FIG. 2. Referring to FIG. 1, FIG. 2 and FIG. 3 together, an electronic device 1000 of the present embodiment is a notebook computer including a first housing 100, a second housing 200 and a hinge assembly 300, wherein the first housing 100 includes a first display part 110, the second housing 200 includes a second display part 210 or a keyboard part, and the hinge assembly 300 is connected between the first housing 100 and the second housing 200, so that the first housing 100 can be opened or closed relative to the second housing 200.

The hinge assembly 300 includes a first fixed block 310, a second fixed block 320, a first polyline rod 330, a second polyline rod 340, at least one damper rod 392 and at least one fastener 394. The first fixed block 310 has a first end 311 and a second end 312, and the first end 311 of the first fixed block 310 is attached to the first housing 100. The second fixed block 320 has a third end 321 and a fourth end 322, and the third end 321 of the second fixed block 320 is attached to the second housing 200. The first polyline rod 330 or connecting rod has a fifth end 331 and a sixth end 332, wherein the fifth end 331 is slidably and rotatably connected to the second end 312 of the first fixed block 310, and the sixth end 332 is rotatably or swingably connected to the fourth end 322 of the second fixed block 320. The second polyline rod 340 or connecting rod has a seventh end 341 and an eighth end 342, wherein the seventh end 341 is slidably and rotatably connected to the fourth end 322 of the second fixed block 320, and the eighth end 342 is rotatably or swingably connected to the second end 312 of the first fixed block 310 and the sixth end 332 of the first polyline rod 330. The damper rod 392 is fixed to the first fixed block 310, wherein the damper rod 392 has an axial direction parallel to an assembly direction X of the first fixed block 310, the second fixed block 320, the first polyline rod 330 and the second polyline rod 340. The fastener 394 is fixed to the first fixed block 310, and a distal end (not denoted) of the damper rod 392 is fastened into the fastener 394, wherein the damper rod 392 may be driven by the first polyline rod 330 or the second polyline rod 340 to move relative to the fastener 394 along the axial direction.

In the present embodiment, there are disposed two damper rods 392 and two fasteners 394, wherein the fasteners 394 are fixed to two opposing sides of the first fixed block 310 and are hollow cylinders; one distal end (not denoted) of the damper rods 392 penetrates into the fasteners 394 corresponding thereto, and the other distal end 3921 of the damper rods 392 is linked to the first polyline rod 330. Thus, when the first polyline rod 330 moves relative to the first fixed block 310, the damper rods 392 are driven by the first polyline rod 330 to move relative to the fasteners 394 being hollow cylinders.

Figure 4A:
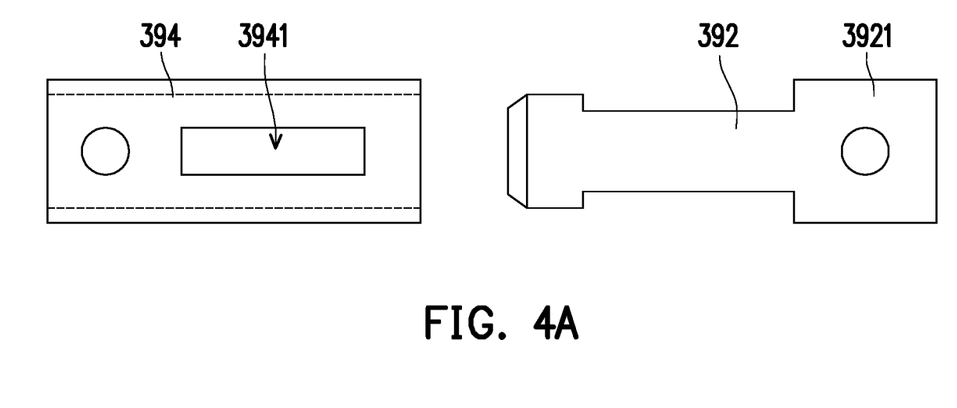
FIG. 4A and FIG. 4B are schematic views illustrating two embodiments of a damper rod and a fastener.
Figure 4B:
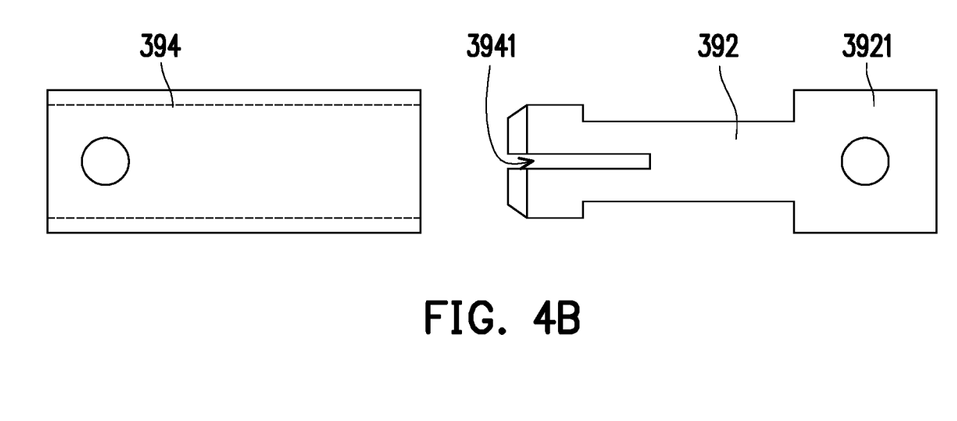

FIG. 4A and FIG. 4B are schematic views illustrating two embodiments of the damper rod 392 and the fastener 394. It can be seen from FIG. 4A that, in one embodiment, the fastener 394 being a hollow cylinder has a slit 3941, and the distal end of the damper rod 392 which is inserted into the fastener 394 has a wedge shape, wherein when the wedge-shaped distal end enters deeper into the fastener 394, the slit 3941 enables the entire fastener 394 to have ability to deform and thus provides a buffering function, thereby preventing the fastener 394 from being cracked and damaged due to the deep insertion of the distal end. It can be seen from FIG. 4B that, in another embodiment, the distal end of the damper rod 392 which is inserted into the fastener 394 similarly has a wedge shape, and the slit 3941 is provided at the distal end of the damper rod 392 for being inserted into the fastener 394. This slit 3941 allows room for deformation of the distal end. Thus, when the wedge-shaped distal end enters deeper into the fastener 394, by the slit 3941, the distal end is deformed according to an inner shape of the fastener 394, thereby preventing the fastener 394 from being expanded by the distal end of the damper rod 392 and thus being cracked and damaged.

Referring then to FIG. 1, FIG. 2 and FIG. 3, following the above, the first polyline rod 330 and the second polyline rod 340 include a plurality of polyline rod members. In other words, the first polyline rod 330 and the second polyline rod 340 have the same size, structure and shape, wherein the polyline rod members which constitute the first polyline rod 330 are disposed in a direction opposite that in which the polyline rod members which constitute the second polyline rod 340 are disposed. In terms of the present embodiment, the first polyline rod 330 includes two polyline rod members and the second polyline rod 340 includes three polyline rod members. Each polyline rod member has a first shaft hole 333, a second shaft hole 334 and a third shaft hole 335. The first shaft hole 333 is located on one distal end of the polyline rod member, and the second shaft hole 334 and the third shaft hole 335 are located on the other distal end of the polyline rod member.

In the present embodiment, the second shaft hole 334 is located between the first shaft hole 333 and the third shaft hole 335 at ends of the first polyline rod 330 or the second polyline rod 340. The second shaft hole 334 is located in middle part of the first polyline rod 330 or the second polyline rod 340. The second shaft hole 334 is at the protruding corner of the first polyline rod 330 or the second polyline rod 340.

In terms of the present embodiment, the fifth end 331 of the first polyline rod 330 has the first shaft hole 333, and the sixth end 332 of the first polyline rod 330 has the second shaft hole 334 and the third shaft hole 335; the seventh end 341 of the second polyline rod 340 has the first shaft hole 333, and the eighth end 342 of the second polyline rod 340 has the second shaft hole 334 and the third shaft hole 335. The hinge assembly 300 further includes a first fixed shaft 360, wherein the first fixed shaft 360 is inserted through the third shaft hole 335 of the eighth end 342 of the second polyline rod 340 and the second end 312. In this way, by the first fixed shaft 360, the second polyline rod 340 can be swung relative to the first fixed block 310.

In addition, the hinge assembly 300 further includes a second fixed shaft 370, and the second fixed shaft 370 is inserted through the third shaft hole 335 of the sixth end 332 of the first polyline rod 330 and the fourth end 322, so that the first polyline rod 330 can be swung relative to the second fixed block 320. In addition, the hinge assembly 300 further includes a third fixed shaft 380, and the third fixed shaft 380 passes through the second shaft holes 334 of the first polyline rod 330 and the second polyline rod 340. Thus, the first polyline rod 330 and the second polyline rod 340 can be swung relative to each other with the third fixed shaft 380 serving as an axis of swinging.

The hinge assembly 300 further includes a first sliding shaft 351 and a second sliding shaft 352, wherein the second end 312 has a pair of first sliding slots 313 and the fourth end 322 has a pair of second sliding slots 323, and the first sliding shaft 351 passes through the first sliding slots 313 and the first shaft hole 333 of the first polyline rod 330. Thus, while the first polyline rod 330 can be swung relative to the first fixed block 310, the first polyline rod 330 can also be translated relative to the first fixed block 310 by movement of the first sliding shaft 351 within the first sliding slots 313. Similarly, since the second sliding shaft 352 passes through the second sliding slots 323 and the first shaft hole 333 of the second polyline rod 340, while the second polyline rod 340 can be swung relative to the second fixed block 320, the second polyline rod 340 can also be translated relative to the second fixed block 320 by movement of the second sliding shaft 352 within the second sliding slots 323.

Figure 5A:
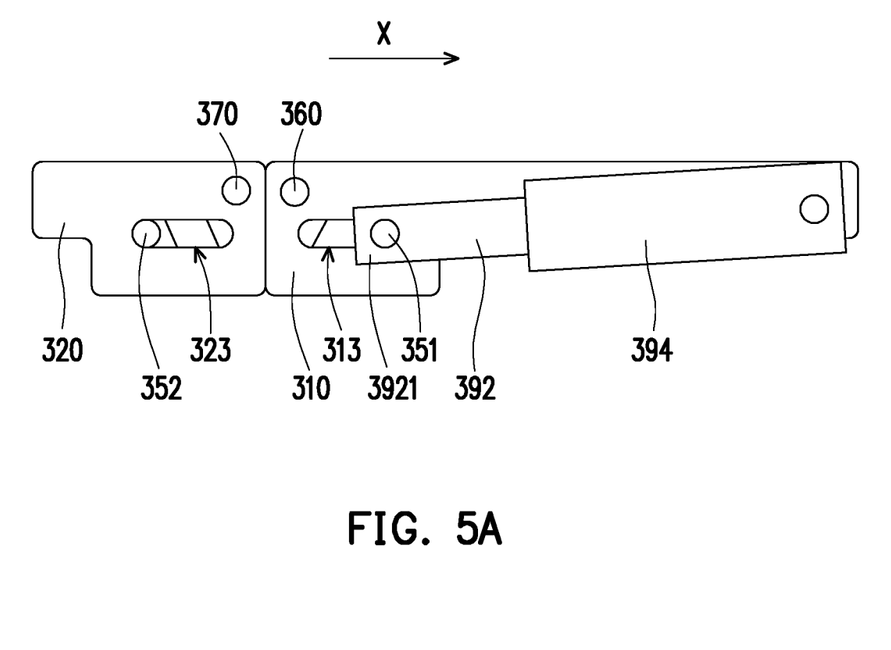
FIG. 5A to FIG. 5D are breakdown views illustrating a swinging operation of a first fixed block relative to a second fixed block.

FIG. 5A to FIG. 5D are breakdown views illustrating a swinging operation of a first fixed block relative to a second fixed block. Referring to FIG. 2, FIG. 3 and FIG. 5A together, when the first housing 100 of the electronic device 1000 (shown in FIG. 1) is opened 180 degrees relative to the second housing 200, the first fixed block 310 attached to the first housing 100 is also opened 180 degrees relative to the second fixed block 320 attached to the second housing 200. At this moment, an upper surface 100a of the first housing 100 is coplanar with an upper surface 200a of the second housing 200 (as shown in FIG. 1). Moreover, the first sliding shaft 351 is located on the right side of the first sliding slot 313, and the second sliding shaft 352 is located on the left side of the second sliding slot 323. The upper surface 100a may be a display plane or a touch display plane, and the upper surface 200a may be a touch plane or another touch display plane. By the technical solution provided in the present case, a gap between the first housing 100 and the second housing 200 can be reduced to integrate the upper surface 100a with the upper surface 200a to obtain a larger plane.

Figure 5B:
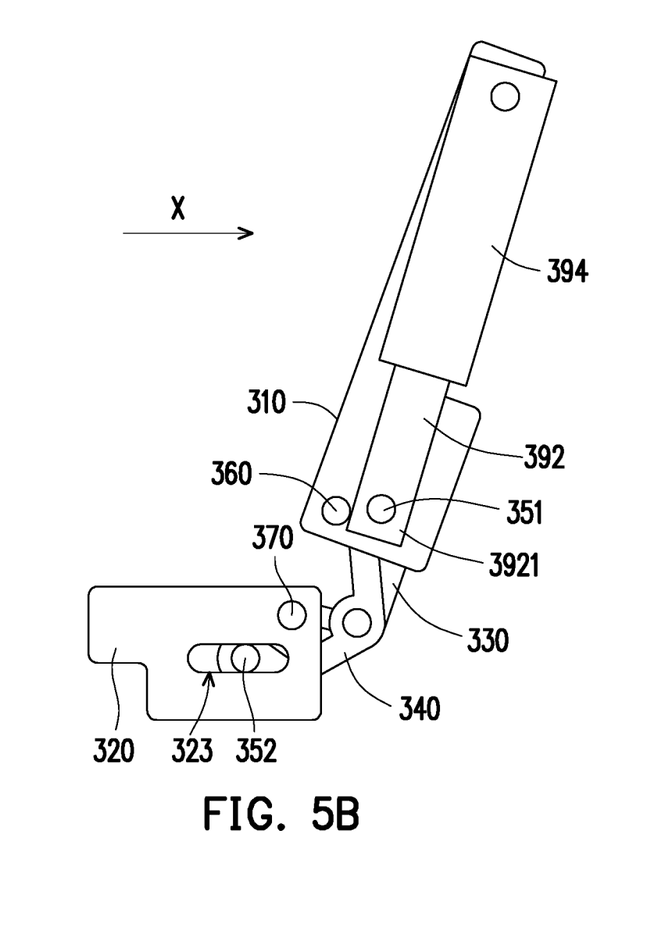
Figure 5C:
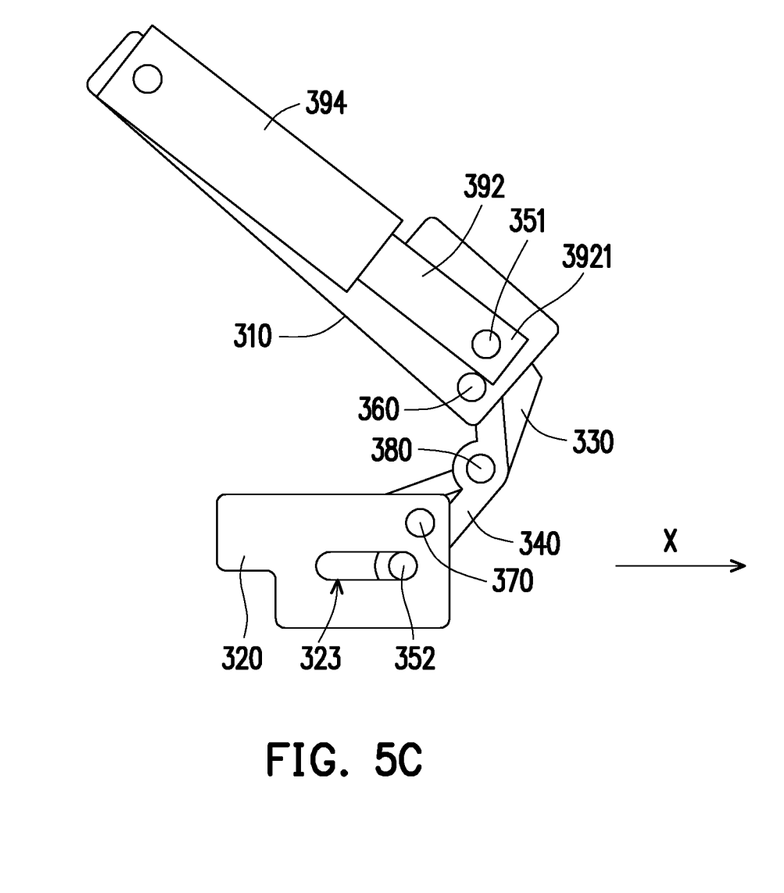
Figure 5D:
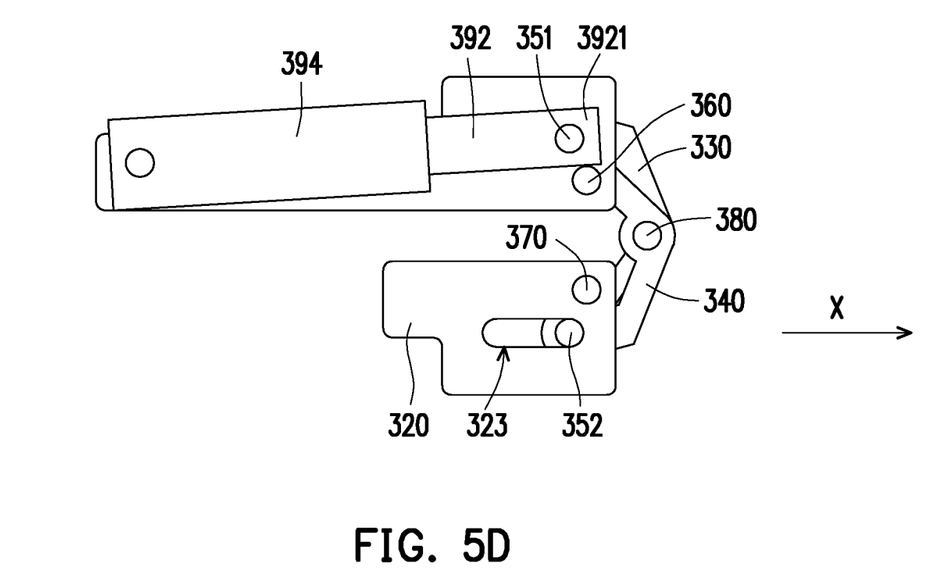

Referring next to FIG. 5B, FIG. 5C and FIG. 5D, when the first housing 100 (shown in FIG. 1) of the electronic device 1000 (shown in FIG. 1) is closed relative to the second housing 200 (shown in FIG. 1), the first polyline rod 330 and the second polyline rod 340 are swung relative to each other with the third fixed shaft 380 serving as the axis of swinging. Meanwhile, by being pulled by the first housing 100, the second sliding shaft 352 translationally slides from the left side to the right side of the second sliding slot 323. Due to the relative swinging between the first fixed shaft 360, the second fixed shaft 370, the third fixed shaft 380, the first fixed block 310, the second fixed block 320, the first polyline rod 330 and the second polyline rod 340, and under limitations that the sixth end 332 of the first polyline rod 330 is rotatably fixed to the fourth end 322 of the second fixed block 320 by the second fixed shaft 370 and that the eighth end 342 of the second polyline rod 340 is rotatably fixed to the second end 312 of the first fixed block 310 by the first fixed shaft 360, during an overturn of the first housing 100 relative to the second housing 200, the first sliding shaft 351 translationally slides from the left side to the right side of the first sliding slot 313, and the damper rod 392 is driven by the first sliding shaft 351 to enter less deeply into the fastener 394 being a hollow cylinder. By matching the wedge-shaped distal end of the damper rod 392 with the fastener 394 being a hollow cylinder, a torsional force can be provided to fix the first housing 100 at a certain predetermined angle relative to the second housing 200.

Additionally, although the above description provides an example in which two damper rods 392 and two fasteners 394 being hollow cylinders are disposed on two opposing sides of the first fixed block 310, according to actual needs, persons skilled in the art may change where and how many damper rods 392 and hollow cylinders are disposed. For example, two damper rods 392 and two fasteners 394 may also be disposed on two opposing sides of the second fixed block 320. Further, it can be considered to dispose only one damper rod 392 and one fastener 394, and this damper rod 392 and this fastener 394 may be contained in a recess provided in the middle of the first fixed block 310 or the second fixed block 320. Although the structures of the corresponding first polyline rod 330, second polyline rod 340 and other elements are changed in accordance with this design, the same effect of providing torsional force to fix the first housing 100 at a certain predetermined angle relative to the second housing 200 can still be achieved.

[Second Embodiment]

Figure 6A:
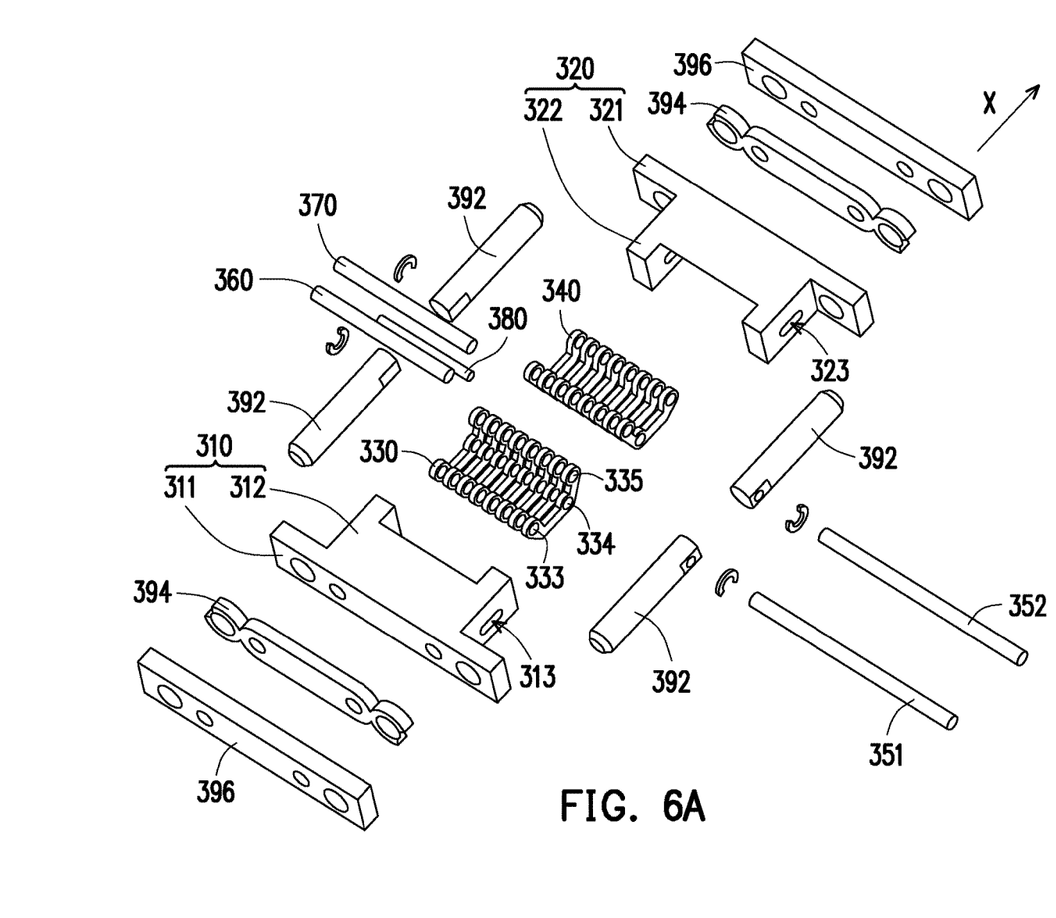
FIG. 6A is a schematic exploded view of a hinge assembly of a second embodiment.
Figure 6B:
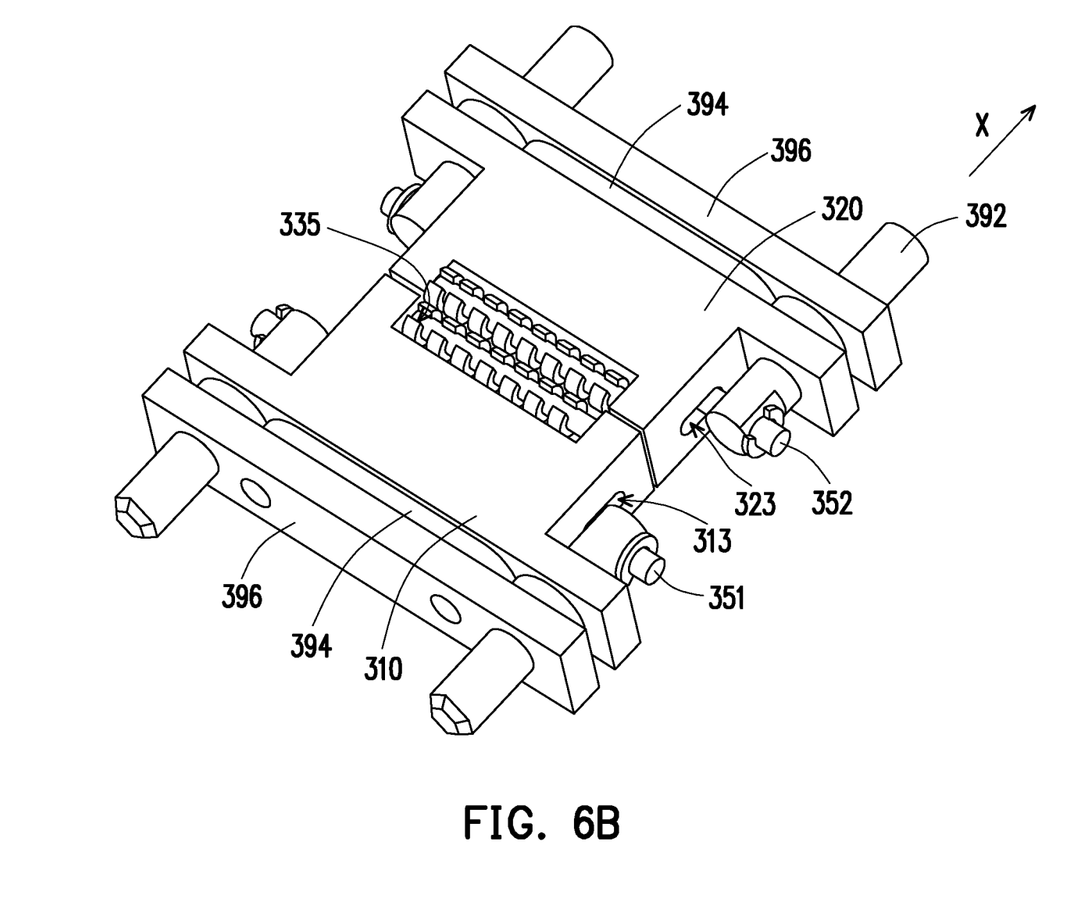
FIG. 6B is a schematic view of assembly of the hinge assembly in FIG. 6A.

FIG. 6A is a schematic exploded view of a hinge assembly of a second embodiment, and FIG. 6B is a schematic view of assembly of the hinge assembly in FIG. 6A. Referring to FIG. 6A and FIG. 6B together, the present embodiment is roughly the same as the aforesaid first embodiment and the same descriptions will be omitted. The present embodiment differs from the aforesaid first embodiment in that, in the present embodiment, the fastener 394 is a C-shaped buckle ring instead of a hollow cylinder, and the numbers of the C-shaped buckle ring and the damper rod 392 are both four. The hinge assembly 300 further includes two fixed plates 396, wherein one pair of the C-shaped buckle rings are integrally formed and disposed between one of the fixed plates 396 and the first fixed block 310, and the other pair of the C-shaped buckle rings are integrally formed and disposed between the other of the fixed plates 396 and the second fixed block 320. The damper rods 392 passes through the first fixed block 310 or the second fixed block 320 corresponding thereto, the C-shaped buckle rings, and the fixed plates 396 corresponding thereto. Similarly, a distal end of the damper rods 392 is linked to the first sliding shaft 351 and the second sliding shaft 352, and the other distal end 3921 (shown in FIG. 2) of the damper rods 392 is fastened into the C-shaped buckle rings.

In addition, the third shaft hole 335 of the present embodiment may be composed of a C-shaped ring, and the C-shaped ring may similarly allow the insertion of the first fixed shaft 360 or the second fixed shaft 370 therethrough so that the first polyline rod 330 and the second polyline rod 340 can be rotatably fixed to the second fixed block 320 and the first fixed block 310 corresponding thereto.

Following the above, when the first housing 100 is swung relative to the second housing 200, the translational sliding of the first sliding shaft 351 within the first sliding slot 313 and the translational sliding of the second sliding shaft 352 within the second sliding slot 323 drive the damper rods 392 to move relative to the C-shaped buckle rings. Similarly to the slit 3941 in the aforesaid first embodiment, the C-shaped buckle rings provide room for elastic defoiination. Therefore, by matching the C-shaped buckle rings and the damper rods 392 with each other, sufficient torsional force can be provided to fix the first housing 100 and the second housing 200 at predetermined angles.

In summary, in the electronic device and the hinge assembly thereof according to the invention, by matching the damper rod and the fastener with each other, the torsional force provided to fix the first housing at a predetermined angle relative to the second housing can be adjusted according to an angle between the first housing and the second housing. Meanwhile, deformation of the fastener can be allowed by the slot of the fastener so that a reaction force caused by an increasing interference between the damper rod and the fastener can be regulated. Thus, the structure can be maintained intact.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A hinge assembly comprising: a first fixed block; a second fixed block; a first polyline rod slidably and rotatably connected to the first fixed block and swingably connected to the second fixed block; a second polyline rod slidably in a sliding slot through a shaft and rotatably connected to the second fixed block, swingably connected to the first fixed block and swingably connected to the first polyline rod; at least one damper rod slidably disposed on the shaft of the second fixed block; and at least one fastener fixed to the second fixed block, a distal end of the at least one damper rod being slidably fastened into the at least one fastener.

2. The hinge assembly according to claim 1, wherein the at least one damper rod is driven by the first polyline rod to slide within the fastener.

3. The hinge assembly according to claim 1, wherein each of the first polyline rod and the second polyline rod has a plurality of shaft holes.

4. The hinge assembly according to claim 3, wherein one of the shaft holes is located between the other shaft holes at ends of the first polyline rod or the second polyline rod.

5. The hinge assembly according to claim 3, wherein one of the shaft holes is located in the middle part of the first polyline rod or the second polyline rod.

6. The hinge assembly according to claim 3, wherein one of the shaft holes is located at a protruding corner of the first polyline rod or the second polyline rod.

7. The hinge assembly according to claim 3, further comprising a first fixed shaft inserted through the corresponding shaft hole of the second polyline rod and the first fixed block.

8. The hinge assembly according to claim 3, further comprising a second fixed shaft inserted through the corresponding shaft hole of the first polyline rod and the second fixed block.

9. The hinge assembly according to claim 3, further comprising a third fixed shaft passing through the corresponding shaft holes of the first polyline rod and the second polyline rod.

10. The hinge assembly according to claim 3, further comprising a first sliding shaft, wherein the first fixed block has a pair of first sliding slots, and the first sliding shaft passes through the pair of first sliding slots and the corresponding shaft hole of the first polyline rod.

11. The hinge assembly according to claim 3, further comprising a second sliding shaft, wherein the second fixed block has a pair of second sliding slots, and the second sliding shaft passes through the pair of second sliding slots and the corresponding shaft hole of the second polyline rod.

12. The hinge assembly according to claim 1, wherein the fastener has a slit.

13. The hinge assembly according to claim 1, wherein the distal end of the at least one damper rod being fastened into the fastener has a slit.

14. A hinge assembly comprising: a first fixed block; a second fixed block; a polyline rod module movably connected to the first fixed block and the second fixed block and slidably in a sliding slot through a shaft; a first damper rod slidably disposed on the shaft of the first fixed block; a first fastener fixed to the first fixed block, a distal end of the first damper rod comprising a wedge shape being fastened into a hollow cylinder of the first fastener; a second damper rod slidably disposed on the shaft of the second fixed block; and a second fastener fixed to the second fixed block, a distal end of the second damper rod being slidably fastened into the second fastener.

15. The hinge assembly according to claim 14, wherein the polyline rod module comprises:
   a first polyline rod slidably connected to the first fixed block and swingably connected to the second fixed block; and
   a second polyline rod slidably connected to the second fixed block, swingably connected to the first fixed block and swingably connected to the first polyline rod.

16. The hinge assembly according to claim 14, further comprising a pair of fixed plates, wherein the first damper rod passes through the first fixed block, the first fastener and one of the fixed plates, and the second damper rod passes through the second fixed block, the second fastener and the other of the fixed plates.

17. An electronic device comprising: a first housing; a second housing; a first fixed block attached to the first housing; a second fixed block attached to the second housing; a polyline rod module movably connected to the first fixed block and the second fixed block; a damper rod slidably disposed on the first fixed block; and a fastener fixed to the first fixed block, a distal end of the damper rod being slidably fastened into the fastener; and the polyline rod module comprises: a first polyline rod slidably connected to the first fixed block through a first shaft and swingably connected to the second fixed block; and a second polyline rod slidably connected to the second fixed block through a second shaft, swingably connected to the first fixed block and swingably connected to the first polyline rod.

18. The electronic device according to claim 17, wherein when an included angle of 180 degrees is formed between the first housing and the second housing, an upper surface of the first housing is coplanar with an upper surface of the second housing.

19. A hinge assembly comprising:
   a first fixed block;
   a second fixed block;
   a first polyline rod slidably and rotatably connected to the first fixed block and swingably connected to the second fixed block;
   a second polyline rod slidably and rotatably connected to the second fixed block, swingably connected to the first fixed block and swingably connected to the first polyline rod;

at least one damper rod slidably disposed on the second fixed block; and at least one fastener fixed to the second fixed block, a distal end of the at least one damper rod comprising a wedge shape being slidably fastened into a hollow cylinder of the at least one fastener.

20. A hinge assembly comprising:

a first fixed block;

a second fixed block;

a polyline rod module movably connected to the first fixed block and the second fixed block;

a first damper rod slidably disposed on the first fixed block; a first fastener fixed to the first fixed block, a distal end of the first damper rod being fastened into the first fastener;

a second damper rod slidably disposed on the second fixed block; and a second fastener fixed to the second fixed block, a distal end of the second damper rod comprising a wedge shape being slidably fastened into a hollow cylinder of the second fastener.

21. An electronic device comprising:

a first housing; a second housing;

a first fixed block attached to the first housing;

a second fixed block attached to the second housing;

a polyline rod module movably connected to the first fixed block and the second fixed block;

a damper rod slidably disposed on the first fixed block; and a fastener fixed to the first fixed block, a distal end of the damper rod comprising a wedge shape being slidably fastened into a hollow cylinder of the fastener.

* * * * *

UNITED STATES PATENT AND TRADEMARK OFFICE
CERTIFICATE OF CORRECTION

PATENT NO. : 10,365,695 B2
APPLICATION NO. : 16/112806
DATED : July 30, 2019
INVENTOR(S) : Chia-Chi Lin et al.

Page 1 of 1

It is certified that error appears in the above-identified patent and that said Letters Patent is hereby corrected as shown below:

On the Title Page (62) should read:
(62) Division of application No. 15/891,302, filed on Feb. 7, 2018, now Pat. No. 10,152,095.

Signed and Sealed this
Twenty-second Day of October, 2019

Andrei Iancu
*Director of the United States Patent and Trademark Office*